(12) United States Patent
Hou

(10) Patent No.: US 8,416,563 B2
(45) Date of Patent: Apr. 9, 2013

(54) SWAPPING APPARATUS OF ELECTRONIC DEVICE

(75) Inventor: Fu-Teng Hou, New Taipei (TW)

(73) Assignee: Chicony Power Technology Co., Ltd., New Taipei (TW)

( * ) Notice: Subject to any disclaimer, the term of this patent is extended or adjusted under 35 U.S.C. 154(b) by 239 days.

(21) Appl. No.: 13/006,476

(22) Filed: Jan. 14, 2011

(65) Prior Publication Data

US 2012/0182671 A1 Jul. 19, 2012

(51) Int. Cl.
G06F 1/16 (2006.01)
H05K 7/16 (2006.01)
A47B 81/00 (2006.01)
A47F 7/00 (2006.01)

(52) U.S. Cl. .............. 361/679.33; 361/679.37; 361/726; 361/727; 312/223.1; 312/223.2; 211/26

(58) Field of Classification Search ............. 361/679.01–679.45, 724–727, 361/679.55–679.59; 312/223.1, 223.2; 211/26
See application file for complete search history.

(56) References Cited

U.S. PATENT DOCUMENTS

| 5,340,340 | A | * | 8/1994 | Hastings et al. | 439/64 |
| 5,673,171 | A | * | 9/1997 | Varghese et al. | 361/679.34 |
| 6,351,379 | B1 | * | 2/2002 | Cheng | 361/679.33 |
| 6,556,432 | B2 | * | 4/2003 | Chen et al. | 361/679.33 |
| 6,669,497 | B2 | * | 12/2003 | Westphall et al. | 439/325 |
| 6,956,745 | B2 | * | 10/2005 | Kerrigan et al. | 361/726 |
| 7,423,869 | B2 | * | 9/2008 | Su | 361/679.33 |
| 7,443,668 | B2 | * | 10/2008 | Hsu | 361/679.33 |

* cited by examiner

*Primary Examiner* — Jayprakash N Gandhi
*Assistant Examiner* — Nidhi Desai
(74) *Attorney, Agent, or Firm* — Chun-Ming Shih; HDLS IPR Services

(57) ABSTRACT

A swapping apparatus of an electronic device is installed on the electronic device, and the swapping apparatus includes two shift handles and a latch base, and the two shift handles are respectively and pivotally to two opposite sides of the electronic device, and each shift handle includes a handle bar and a shift button, and an end of the handle bar is a pivot portion pivotally coupled to the electronic device, and the other end of the handle bar is a connecting portion, and the shift button is elastically sheathed on the connecting portion, and the latch base is fixed to the electronic device and disposed between the two shift buttons, and each of the two shift buttons has a first latch portion and a corresponding second latch portion disposed separately on both sides of the latch base for latching onto the first latch portion.

11 Claims, 9 Drawing Sheets

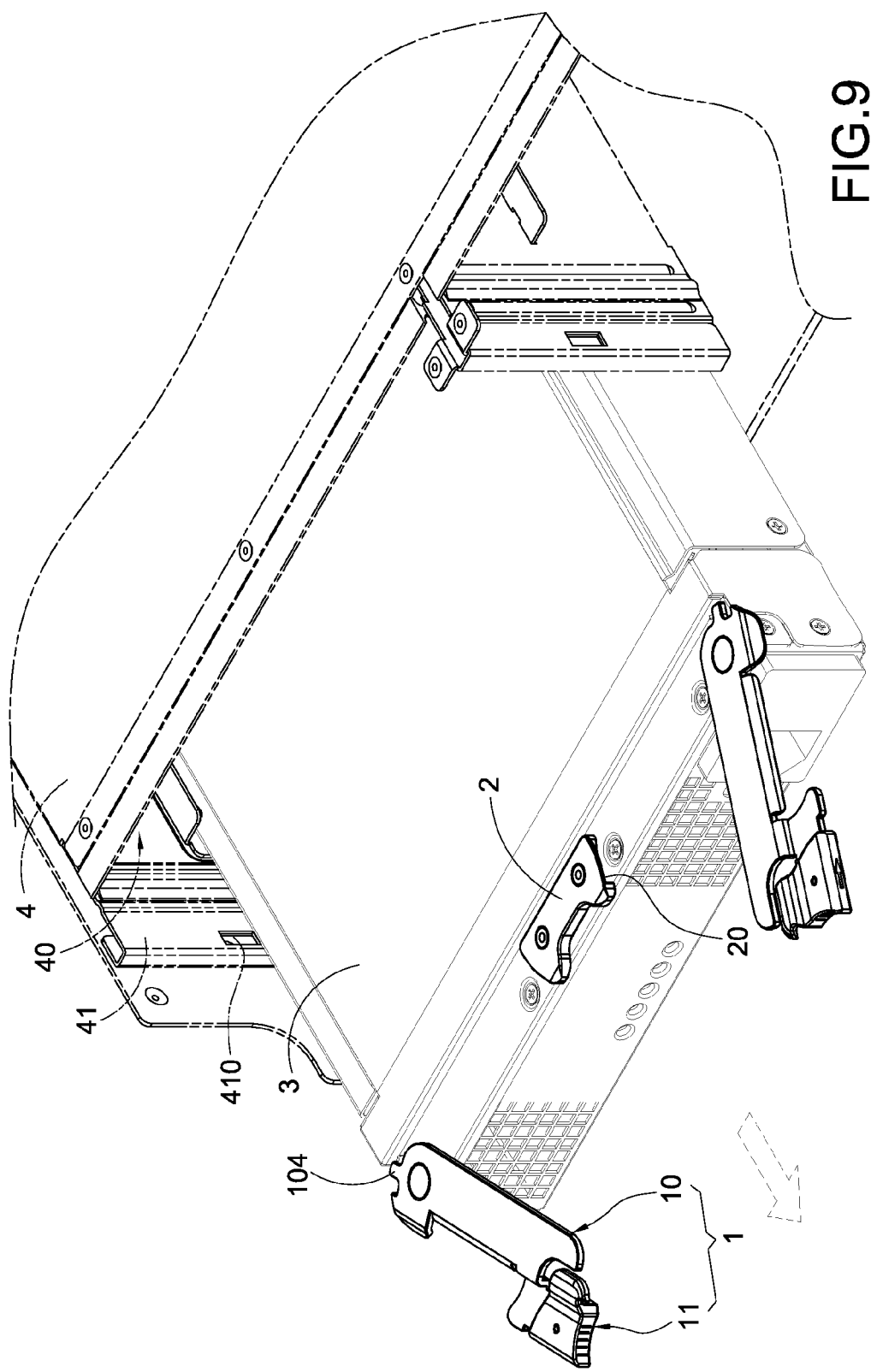

SWAPPING APPARATUS OF ELECTRONIC DEVICE

FIELD OF THE INVENTION

The present invention relates to a large electronic device, in particular to a swapping apparatus for swapping or replacing an electronic device such as a server or its power supply.

BACKGROUND OF THE INVENTION

In general, a conventional industrial computer such as a blade server requires a swap frequently. Since the conventional server or power supply is usually installed in a frame, and the whole server or power supply is installed in a containing slot of the frame, therefore it is necessary to have a component such as a handle to facilitate users to hold and remove the server or power supply. To install the server or its power supply into the containing slot of the frame, a mechanical part or structure is generally used for installing and positioning the server or power supply, and thus the handles of this sort should have the functions of latching and releasing the server or power supply as well as positioning the installed server or power supply automatically.

At present, there are similar server and power supply swapping apparatuses. Although these swapping apparatuses can meet the foregoing requirements, their operations are not convenient enough. For example, the forces applied by left and right hands of a user are generally uneven, and thus a smooth operation of releasing the server or power supply cannot be achieved. Obviously, conventional swapping apparatuses require improvements.

In view of the aforementioned shortcomings of the prior art, the inventor of the present invention based on years of experience in the related industry to conduct extensive researches and experiments, and finally developed a feasible solution in accordance with the present invention to overcome the shortcomings of the prior art.

SUMMARY OF THE INVENTION

Therefore, it is a primary objective of the present invention to provide a swapping apparatus of an electronic device, wherein a structural design of symmetric shift buttons is provided for users to fix or release the electronic device through users' thumbs and index fingers of both hands, and then remove the electronic device accordingly, such that the electronic device can be removed by even forces applied by both hands to swap or replace the electronic device more quickly.

To achieve the foregoing objective, the present invention discloses a swapping apparatus of an electronic device. The swapping apparatus is installed on the electronic device, and includes two shift handles and a latch base, wherein the two shift handles are respectively and pivotally coupled on both opposite sides of the electronic device, and each shift handle includes a handle bar and a shift button, and an end of the handle bar is a pivot portion pivotally coupled to the electronic device, and the other end has a connecting portion. The shift button is elastically sheathed on the connecting portion, and the latch base is fixed to the electronic device and disposed between two shift buttons, and each of the two shift buttons has a first latch portion, and a corresponding second latch portion disposed separately at a lower edge of both sides of the latch base for latching onto the first latch portion.

BRIEF DESCRIPTION OF THE DRAWINGS

FIG. 9 is a schematic view of a removed electronic device of the present invention.

DESCRIPTION OF THE PREFERRED EMBODIMENTS

The technical characteristics and contents of the present invention will become apparent with the following detailed description accompanied with related drawings. The drawings are provided for the purpose of illustrating the present invention only, but not intended for limiting the scope of the invention.

Figure 1:
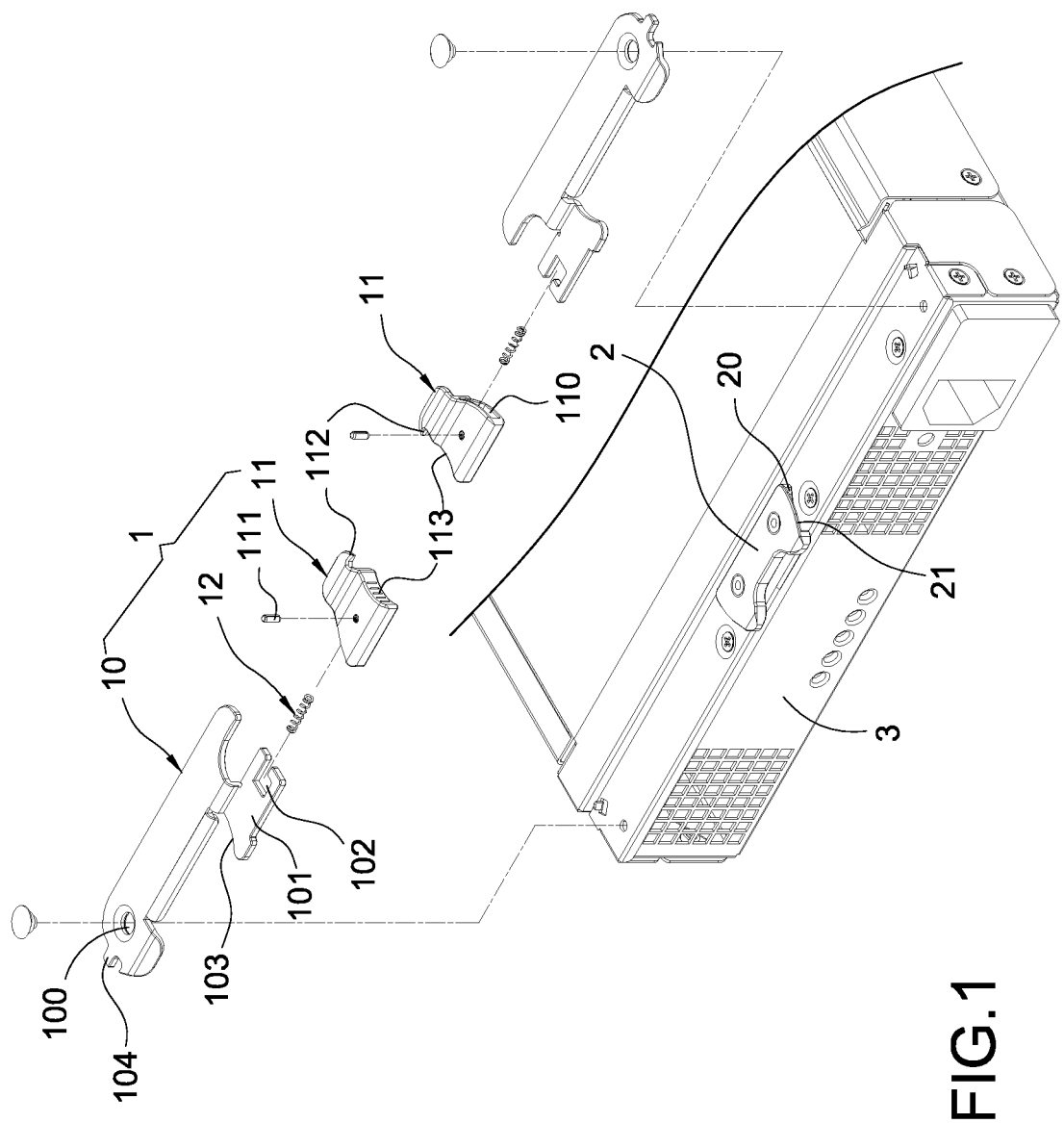
FIG. 1 is an exploded view of an electronic device of the present invention.
Figure 2:
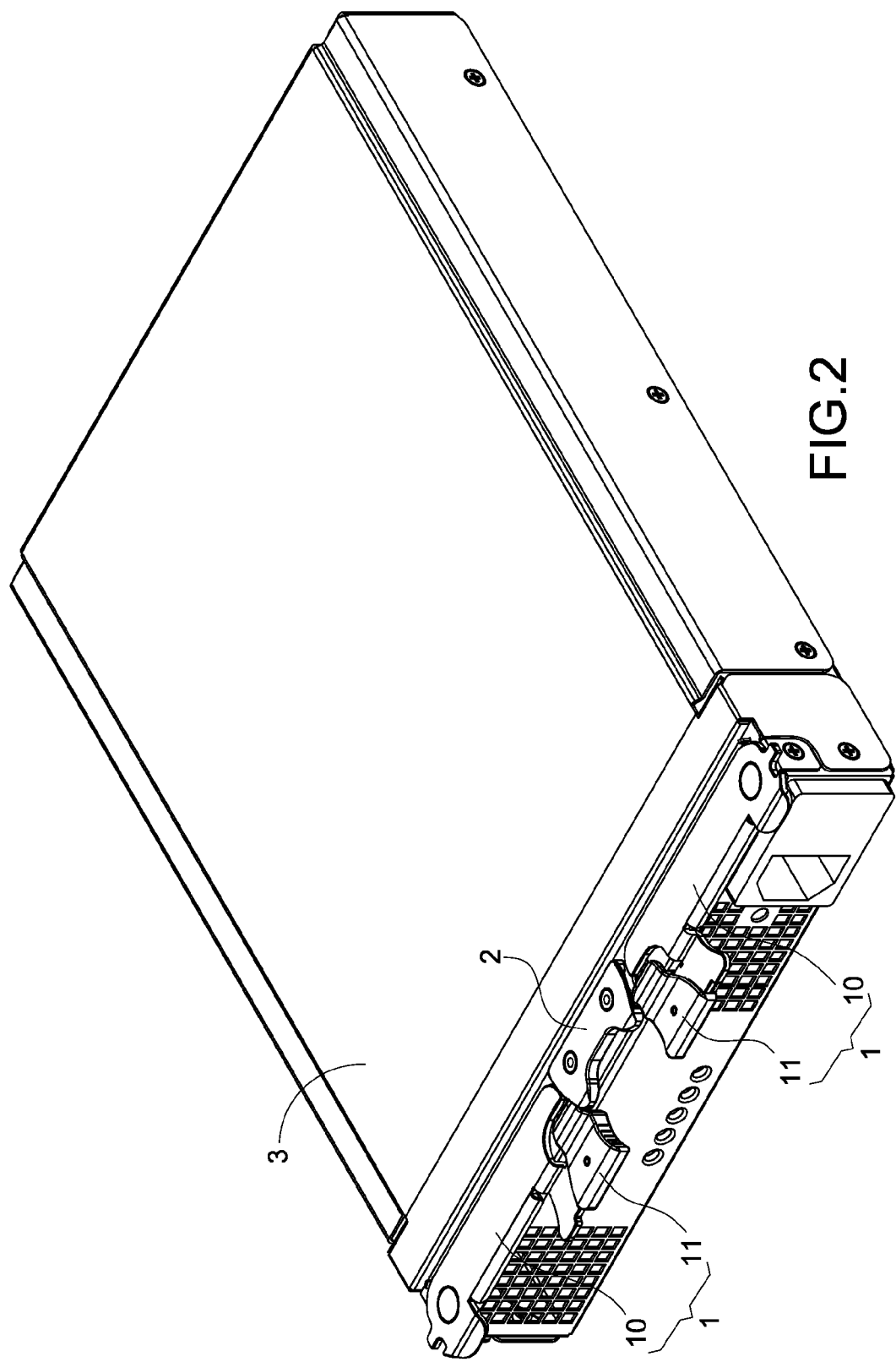
FIG. 2 is a perspective view of an electronic device of the present invention.
Figure 5:
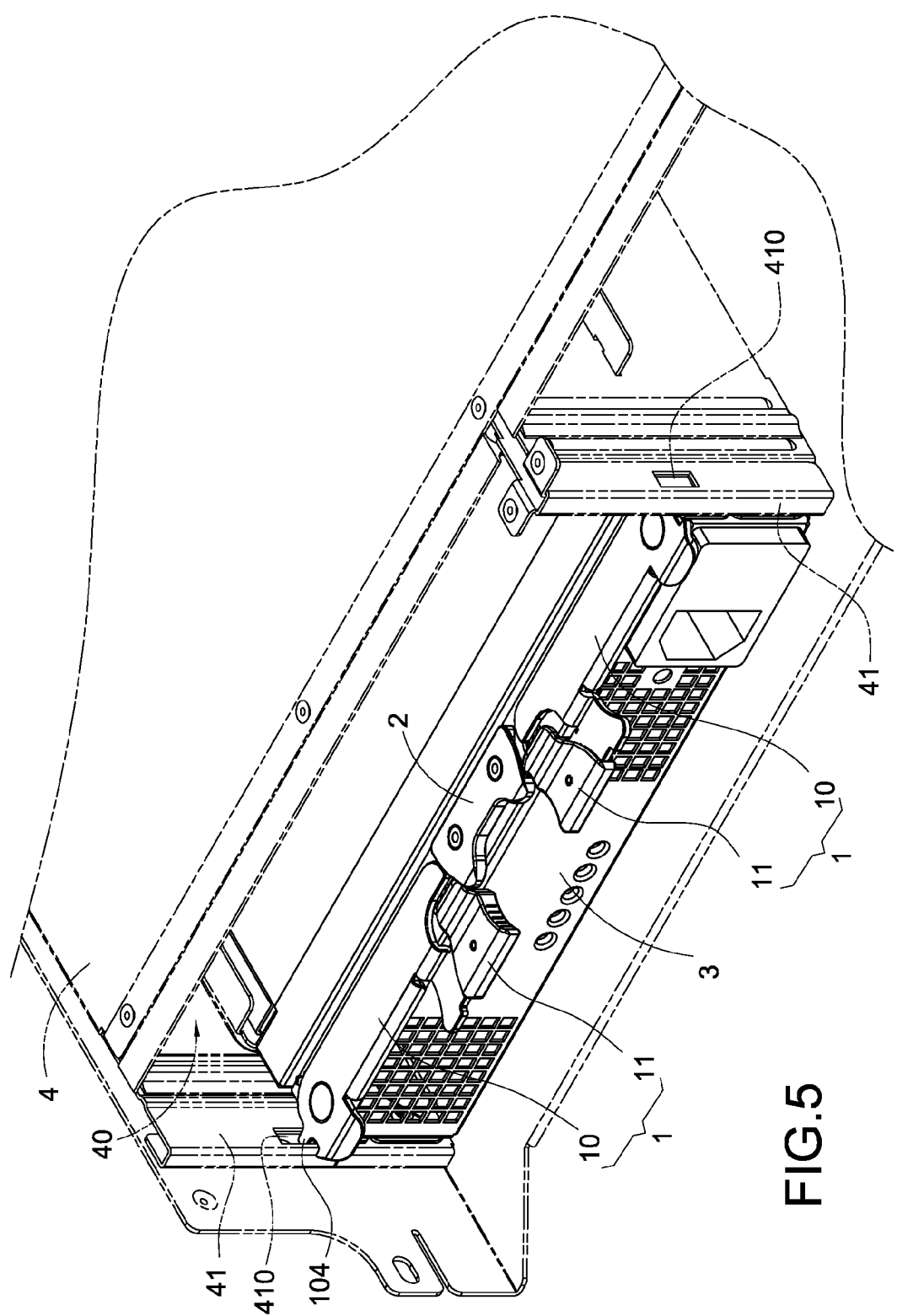
FIG. 5 is a schematic view of an electronic device contained in a frame in accordance with the present invention.

With reference to FIGS. 1 and 2 for an exploded view and a perspective view of an electronic device in accordance with the present invention respectively, the present invention provides a swapping apparatus of an electronic device, and the swapping apparatus is installed to the electronic device 3 (such as a server or its power supply), and is usually installed at a front edge of the electronic device 3 for fixing the electronic device 3 into a containing slot 40 of a frame 4 (as shown in FIG. 5), or removing the electronic device 3 from the containing slot 40 after the electronic device 3 is released from its latch. The swapping apparatus comprises two shift handles 1 and a latch base 2. The two shift handles 1 are respectively and pivotally coupled on both opposite sides at a front edge of the electronic device 3, and each shift handle includes a handle bar 10 and a shift button 11. The handle bar 10 is a rectangular plate with an end as a pivot portion 100 (which can be a pivot hole) provided for pivotally coupling the electronic device 3, and the other end of the handle bar 10 has a connecting portion 101 for sheathing the shift button 11. The shift button 11 is elastically and movably sheathed on a connecting portion 101 of the handle bar 10. In a preferred embodiment of the present invention, the shift button 11 has a hollow portion 110 formed therein and provided for sheathing the connecting portion 101, and an elastic element 12 is installed between the shift button 11 and the connecting portion 101, and a notch 102 is formed on the connecting portion 101 for containing the elastic element 12, and the shift button 11 can be penetrated by a position limit pin 111 and passed through a notch 102 of the connecting portion 101, so as to prevent the shift button 11 from separating from the connecting portion 101.

Figure 3:
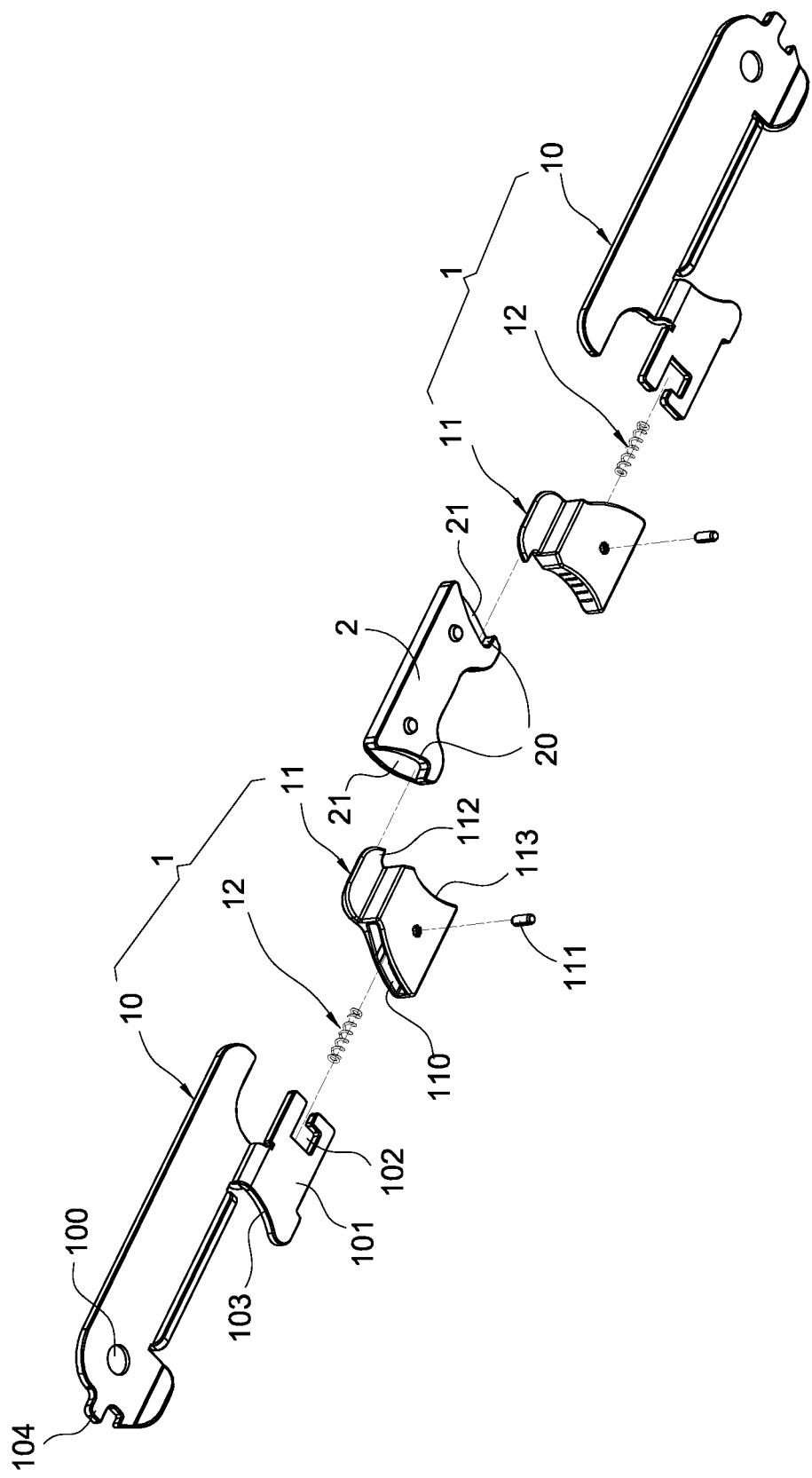
FIG. 3 is an exploded view of an electronic device of the present invention, viewed from another angle.
Figure 4:
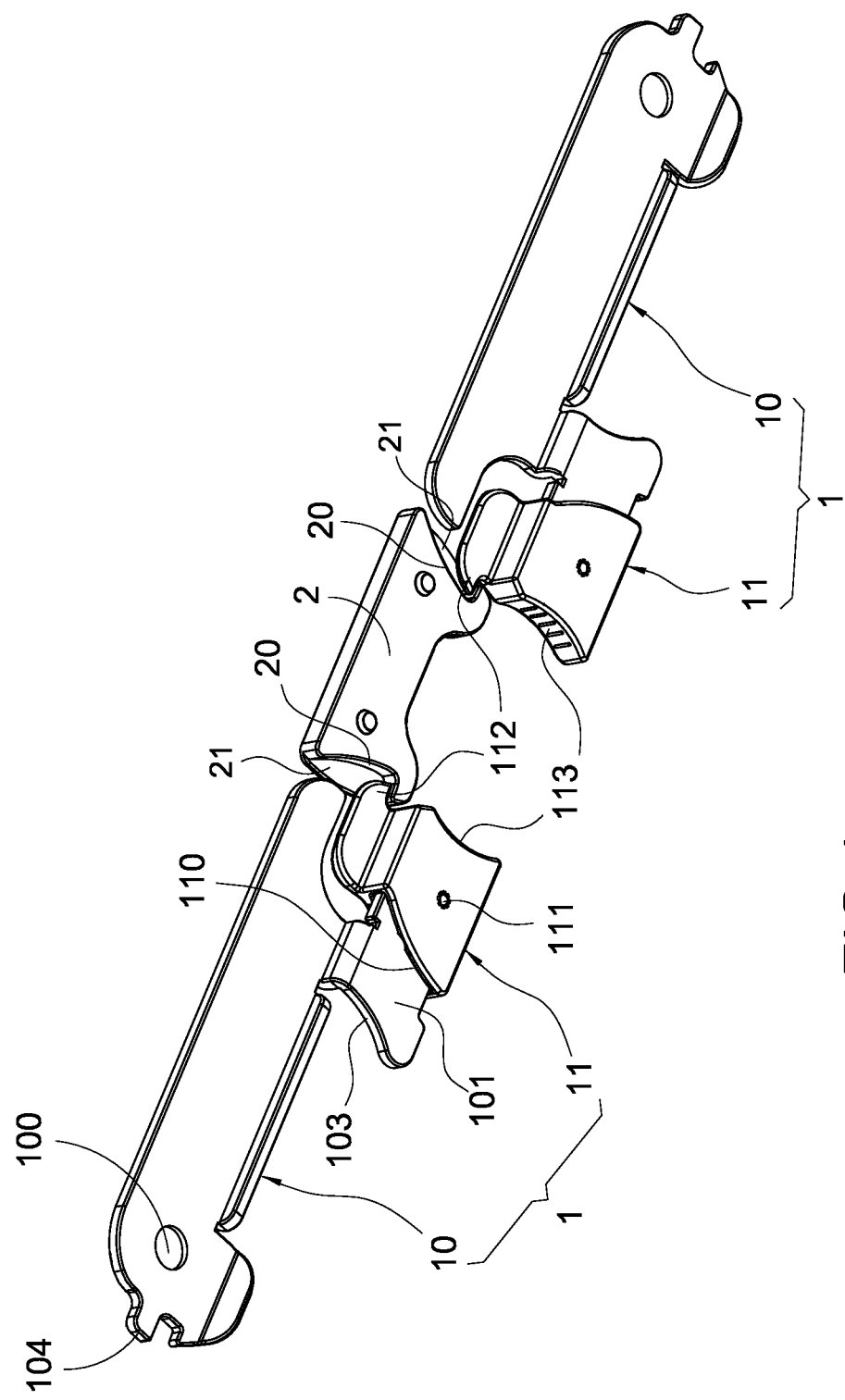
FIG. 4 is a perspective view of an electronic device of the present invention, viewed from another angle.

The latch base 2 is fixed at a front edge of the electronic device 3, and disposed between the two shift buttons 11, such as the middle of the front edge of the electronic device. With reference to FIGS. 3 and 4, each of the two shift buttons 11 has a first latch portion 112, and a corresponding second latch portion 20 formed separately on both opposite sides of the latch base 2. In this preferred embodiment of the present invention, the first latch portion 112 is a protruding latch hook, and the second latch portion 20 is a concave latch hole provided for the two shift buttons 11, so that the first latch portion 112 can be latched to the second latch portion 20 of the latch base 2 (also refer to FIG. 6), and the second latch portion 20 is disposed at a lower edge on both sides of the latch base 2, and a press portion 21 is formed at an upper edge of both sides of the latch base 2 and disposed at a position opposite to the second latch portion 20 to prevent the first latch portion 112 and the second latch portion 20 from being warped when they are latched.

In addition, both sides of each shift button are outwardly turned to facilitate user to apply forces to the two shift buttons 11 by hands, and a concave thumb pressing surface 113 is formed on a side of the latch base 2 proximate to the two shift buttons 11, and a concave index finger pressing surface 103 is formed on a side away from the connecting portion 101, such that a user's thumb and index fingers can hold and apply a force to turn the two shift buttons 11 in order to separate the latch base 2 (Now, the first latch portion 112 and the second latch portion 20 are released from their latched condition).

With the aforementioned assembly, a swapping apparatus of an electronic device in accordance with the present invention can be achieved.

Figure 6:
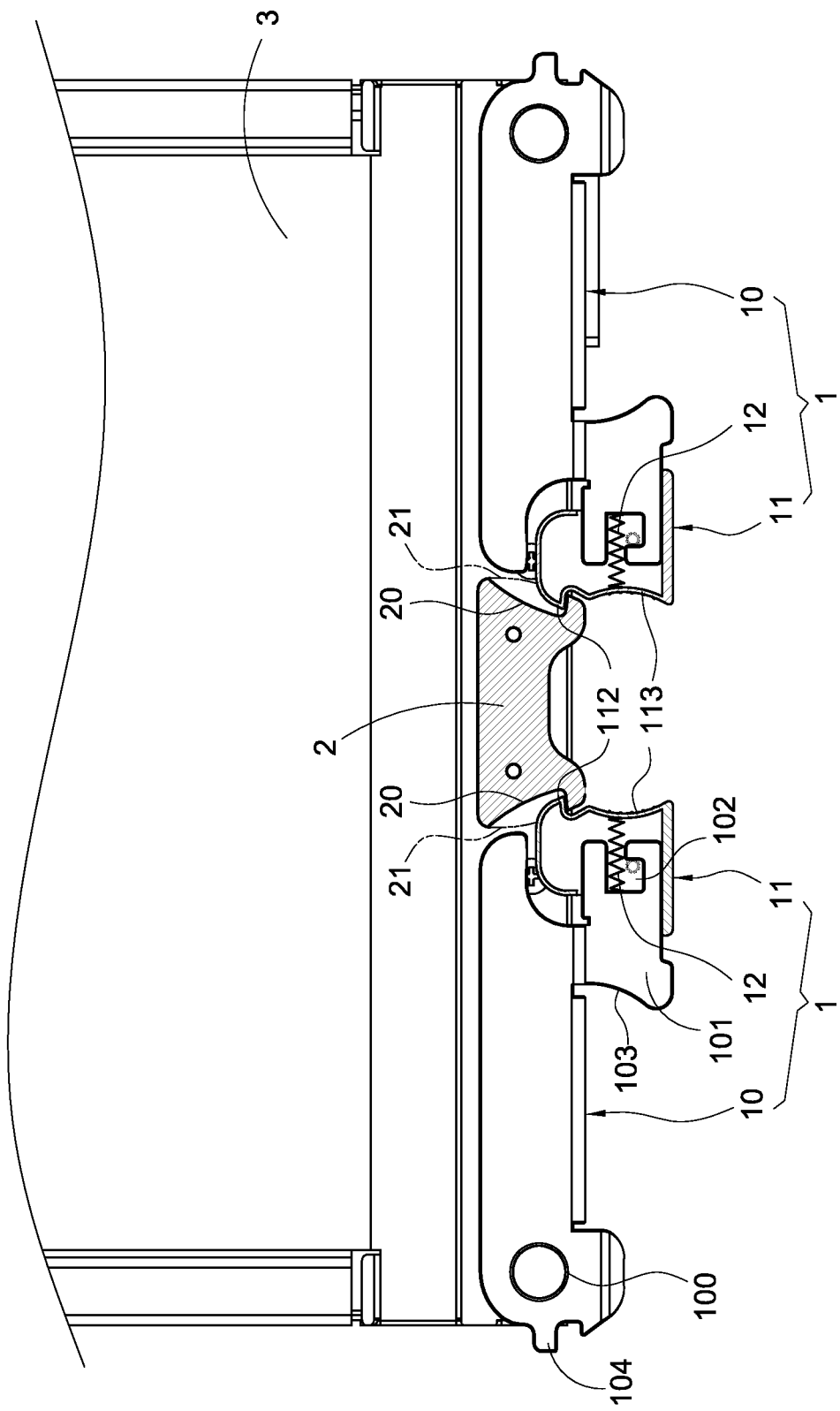
FIG. 6 is a first schematic view of an operation of removing an electronic device in accordance with the present invention.

With reference to FIG. 5, when the electronic device 3 is installed in the containing slot 40 of the frame 4, a positioning hole 410 formed at a front end of both sidewalls 41 of the containing slot 40 of the frame 4 is provided for latching a positioning portion 104 protruded from an external edge of the pivot portion 100 of the two handle bars 10 and provided for fixing the electronic device 3 into the containing slot 40 of the frame 4. Now, the first latch portions 112 of the two shift buttons 11 are latched onto the two second latch portions 20 of the latch base 2 respectively as shown in FIG. 6.

Figure 7:
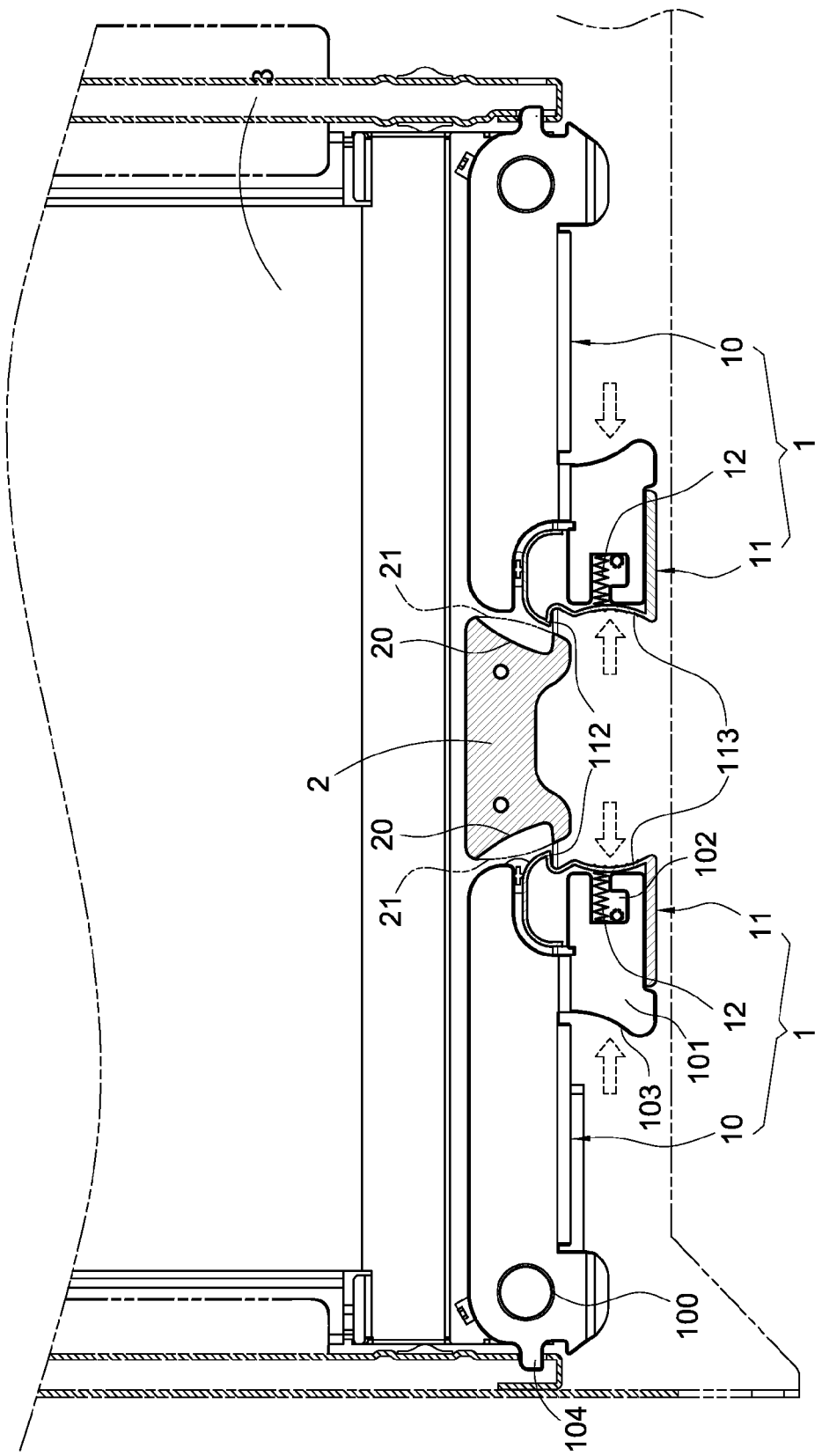
FIG. 7 is a second schematic view of an operation of removing an electronic device in accordance with the present invention.
Figure 8:
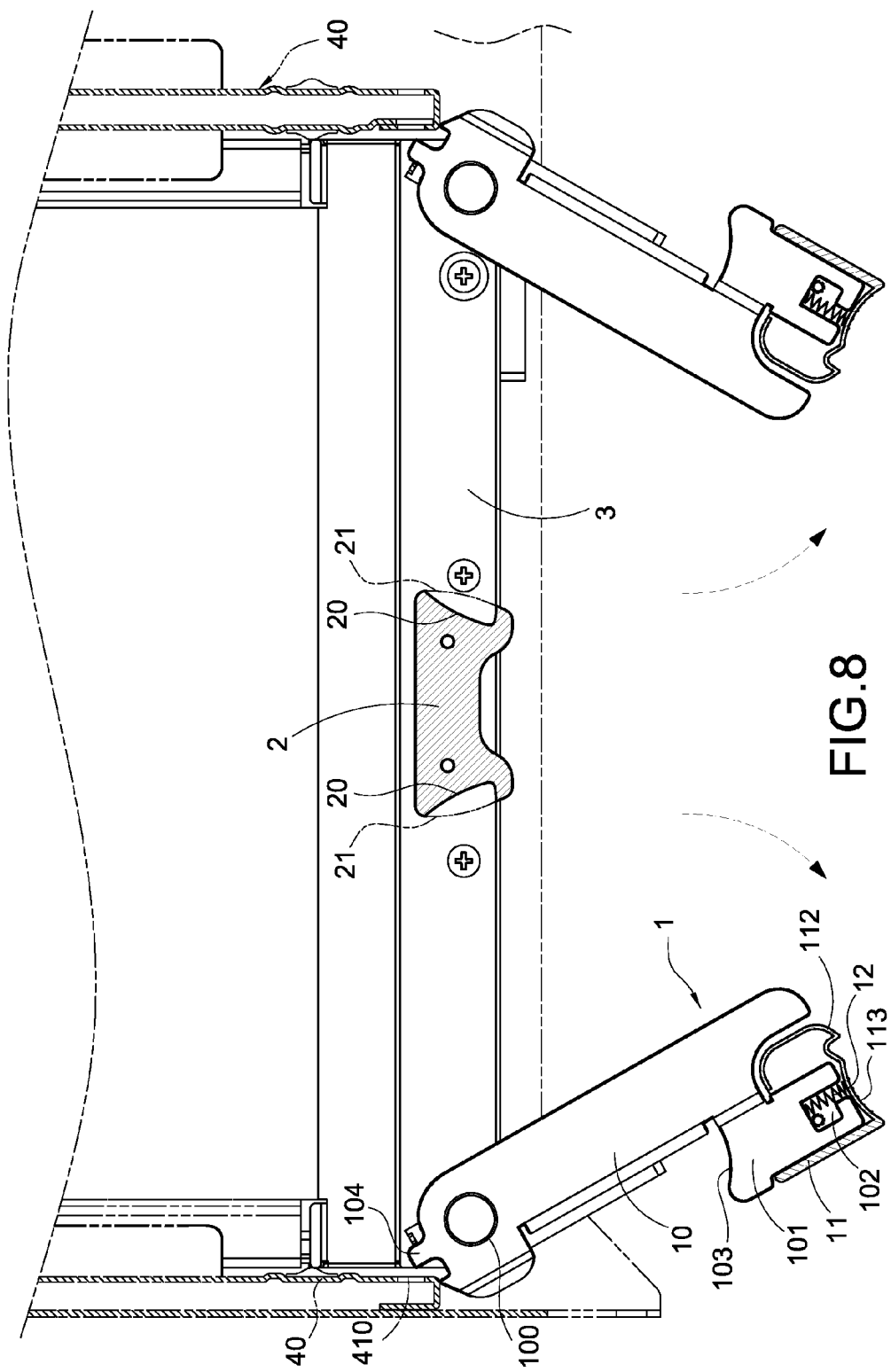
FIG. 8 is a third schematic view of an operation of removing an electronic device in accordance with the present invention.

In FIG. 7, if it is necessary to remove the electronic device 3, a user can hold the two shift buttons 11 by a thumb and an index fingers and apply forces towards both sides, and then the first latch portions 112 of the two shift buttons 11 will be released from the two second latch portions 20 of the latch base 2 respectively. In FIG. 8, after both hands pull out the two shift handles 1, external edges of the two handle bars 10 will abut against both sidewalls 41 of the frame 4 to pull out the electronic device 3. Since the forces applied to both left and right sides are even, therefore the electronic device 3 can be removed more quickly for the swapping or replacing operation (as shown in FIG. 9).

In summation of the description above, the present invention improves over the prior art and complies with the patent application requirements, and thus is duly filed for patent application.

While the invention has been described by means of specific embodiments, numerous modifications and variations could be made thereto by those skilled in the art without departing from the scope and spirit of the invention set forth in the claims.

What is claimed is:

1. A swapping apparatus of an electronic device, installed to the electronic device, and the swapping apparatus comprising:

two shift handles, respectively and pivotally coupled to both opposite sides of the electronic device, and each shift handle including a handle bar and a shift button, and an end of the handle bar being a pivot portion pivotally coupled onto the electronic device, and the other end having a connecting portion, and the shift button being elastically sheathed on the connecting portion; and a latch base, fixed to the electronic device and disposed between the two shift buttons; wherein, each of the two shift buttons has a first latch portion, and a corresponding second latch portion disposed separately on both sides of the latch base for latching onto the first latch portion, wherein the shift button includes a hollow portion formed therein and provided for sheathing the connecting portion, and an elastic element installed between the shift button and the connecting portion.

2. The swapping apparatus of an electronic device as recited in claim 1, wherein the pivot portion of the handle bar is a pivot hole.

3. The swapping apparatus of an electronic device as recited in claim 1, wherein the handle bar has a positioning portion disposed at an external edge of the pivot portion.

4. The swapping apparatus of an electronic device as recited in claim 1, wherein the connecting portion includes a notch formed thereon and provided for containing the elastic element.

5. The swapping apparatus of an electronic device as recited in claim 4, wherein the shift button is penetrated by a position limit pin and passed through a notch of the connecting portion.

6. The swapping apparatus of an electronic device as recited in claim 1, wherein each of the two shift buttons includes a thumb pressing surface concavely formed on a side proximate to the latch base.

7. The swapping apparatus of an electronic device as recited in claim 6, wherein the connecting portion includes an index finger pressing surface concavely formed on a side away from the latch base.

8. The swapping apparatus of an electronic device as recited in claim 1, wherein the connecting portion includes an index finger pressing surface concavely formed on a side away from the latch base.

9. The swapping apparatus of an electronic device as recited in claim 1, wherein the first latch portion is a protruding latch hook, and the second latch portion is a concavely formed latch hole.

10. The swapping apparatus of an electronic device as recited in claim 9, wherein the second latch portion is disposed at a lower edge of both sides of the latch base, and has a press portion formed at an upper edge of both sides of the latch base and corresponding to the second latch portion.

11. The swapping apparatus of an electronic device as recited in claim 1, wherein the latch base is integrally formed with the second latch portions which are respectively extended from both sides of the latch base.

* * * * *